Oct. 5, 1965 HUNG CHANG LIN 3,210,620

SEMICONDUCTOR DEVICE PROVIDING DIODE FUNCTIONS

Filed Oct. 4, 1961

WITNESSES

Edwin E. Bassler

Gordon H Telfer

INVENTOR

Hung C. Lin

BY

ATTORNEY

United States Patent Office 3,210,620
Patented Oct. 5, 1965

3,210,620
SEMICONDUCTOR DEVICE PROVIDING DIODE FUNCTIONS

Hung Chang Lin, Monroeville, Pa., assignor to Westinghouse Electric Corporation, East Pittsburgh, Pa., a corporation of Pennsylvania Filed Oct. 4, 1961, Ser. No. 142,802
2 Claims. (Cl. 317—234)

This invention relates generally to semiconductor structures for providing diode functions, which structures are particularly suitable for incorporation in monolithic semiconductor devices providing an entire circuit function in a unitary body of material.

The semiconductor art has advanced to a point where there is considerable interest in monolithic semiconductor devices, sometimes called functional electronic blocks, which provide within a unitary body of semiconductive material the electronic function of a plurality of individually connected components such as diodes, transistors, capacitors and resistors to form the electronic equivalent of a complete circuit such as an amplifier, multivibrator or logic element. Such devices are formed by the utilization of a group of concepts and techniques often designated in the art as "molecular electronics" or "molecular engineering." The present invention has general application to such devices wherever a diode function must be incorporated in the monolith.

It is the practice, primarily for fabrication convenience, to construct the different active and passive regions of the monolithic devices on the same substrate. Active regions are those wherein the semiconductive properties of the materials are utilized to provide such functions as those of diodes and transistors. Passive regions are those wherein the semiconductor properties are not essential to the provision of the desired electronic function such as those used as resistances. The substrate may be a material forming some of the active and passive regions or it may merely be a support on which the other regions are formed in which case it is generally of high resistivity material (intrinsic as compared with the other regions).

Because of the complexity of the geometry necessary to provide the electronic function of the plurality of components in a typical circuit, ease in fabrication is of extreme importance in the design of any monolithic device. Also the extremely small size of the devices accentuates fabrication problems. For these reasons it is desirable to form the active and passive regions, or the layers from which they are formed, simultaneously on the substrate. That is, assuming an n-type substrate, a p-type layer is formed wherever desired simultaneously on the substrate either by positive methods such as forming p-type material, as by diffusion, only in the desired areas or by negative methods such as diffusing an entire p-type surface and subsequently removing the undesired portion. Additional n-type regions can then be formed on the p-type layer in a similar manner. In this manner, structures providing transistor functions have been provided wherein the substrate serves as the collector, an opposite conductivity type layer thereon serves as the base and a region of the same conductivity type as the substrate serves as the emitter formed on the base.

It is frequently desirable to form regions providing diode functions in another portion of the the device at the same time. Again assuming an n-type substrate it can be seen that diode functions can be provided by forming a p-type region on the surface of the substrate and utilizing the single junction so formed. However, that junction cannot be used if the common substrate causes too much interaction with other portions of the device.

This is often the case even when the substrate is of high resistivity material. Hence it is necessary to apply an additional, isolated n-type region on the p-type region and utilize the second junction so formed as the diode junction.

Diode functions can be provided using the base and emitter of a three region transistor structure. Unfortunately, these diodes are backed by the substrate (collector) which collects most of the carriers injected from the cathode of the diode. This results in an undesirable reduction of the diode current at the anode. This reduction in useful diode current has been found to be roughly comparable to the ratio of collector current to base current in a transistor. If the collector is open, the collector junction becomes forward biased (i.e. saturated). A saturated transistor has a longer switching recovery time than an unsaturated transistor because of excess charge storage.

It is also desirable to provide diode action in a structure having a minimum of spreading resistance. Spreading resistance is the resistance in the second region or anode of the diode. This resistance encountered by carriers which travel laterally (parallel to the junction) for relatively large distances to a contact can be quite high. The reduction of spreading resistance is desirable because it would lessen the forward voltage drop in the diode. When the base and emiter of a transistor structure are operated as a diode with the collector open, the spreading resistance is undesirably high since the carriers must travel to a contact somewhere on the surface of the base.

The undesirable qualities of diodes which are two regions of a three region structure are also present, to some extent, in conventional two region junction diodes. That is, for a given diode made of material of a given resistivity and a p-n junction of a given area, any improvement in its forward voltage drop, spreading resistance and switching time, for example, would be desirable.

It is, therefor, an object of the present invention to provide an improved semiconductor diode.

Another object of the present invention is to provide an improved monolithic semiconductor device.

Another object is to provide an improved semiconductor structure for providing diode functions, particularly suitable for use in monolithic devices.

Another object is to provide a semiconductor structure providing improved diode functions in the same block as a structure providing transistor functions.

Another object is to provide an improved semiconductor structure for providing diode functions, particularly suitable for incorporation in monolithic devices, whereby useful diode current is maximized, spreading resistance and forward voltage drop are minimized and switching time is shortened.

Another object is to provide structures achieving the foregoing objects, which structures may be readily fabricated.

According to the present invention, a semi-conductor structure is provided for giving diode functions which comprises three adjacent regions of alternate semiconductivity type in the manner of a junction transistor wherein one of the junctions is shorted. In this way, removal of carriers by the extra region is avoided and the effect of spreading resistance is reduced as will be subsequently explained more fully. The shorted junction may be either that between the second region (base) and the first region (emitter) or that between the base and the third region (collector). In each case a high inverse voltage is maintained and improved characteristics over similar devices without the junction shorted, such as a lower forward voltage, result. The structure with the collector shorted to base has been found to have a particularly fast switching characteristic.

The semiconductor structure in accordance with this invention, which may be called a "transistorized diode," is particularly advantageous, for ease in fabrication, when used in a monolithic device including a transistor structure. Where one or more diodes are desired of the same type (n-p for example) as the emitter-base of the transistor, they may be easily formed by the same fabrication operations with the addition of conductive means to short the base-collector junction in each of the transistorized diodes.

The features of the present invention which are believed to be novel are set forth with particularity in the appended claims. The present invention, including its structure, operation and manner of fabrication, together with the above-mentioned and further objects and advantages thereof, may best be understood by reference to the following description, taken in connection with the accompanying drawings, in which:

Figures 1A, 1B, 1C, 1D, 2, 3, 4, 5, 6:
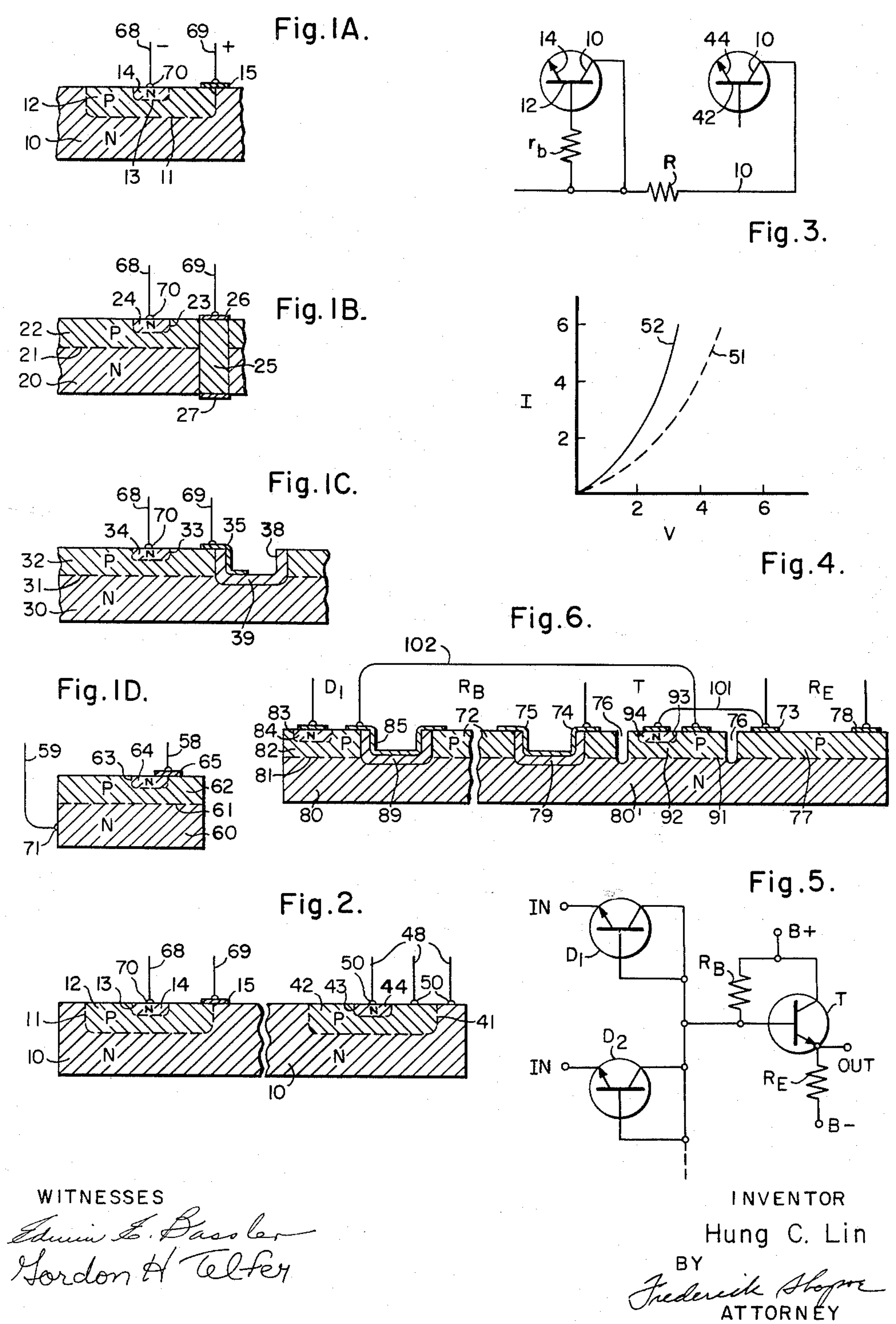
FIGURES 1A through 1D are cross-sectional views of semiconductor devices having a structure providing diode functions in accordance with the present invention.
FIG. 2 is a partial cross-sectional view of a monolithic semiconductor device including a structure providing transistor functions and a structure providing diode functions in accordance with this invention.
FIG. 3 is the equivalent circuit of the portion of monolithic device shown in FIG. 2.
FIG. 4 is a set of curves by which performance of transistorized diodes in accordance with this invention may be compared with the prior art.
FIG. 5 is a diagram of an AND gate circuit shown as an example of a circuit suitable for incorporation in a monolithic device.
FIG. 6 is a sectional view of a monolithic semiconductor device providing the function of the circuit of FIG. 5 and utilizing features of the present invention.

It is to be understood that in the following description and in the drawing, the indication of a semiconductive region as being of a particular type of semiconductivity is merely by way of example and the semiconductivity type of the regions in a particular device may be reversed from that shown. Also, the teachings of the invention are equally applicable to structures which include, in addition to the regions shown, a relatively pure or intrinsic region thus forming NPIN or PNIN configurations. Wherever the description refers to a three region structure (such as NPN) with one outer region being of high resistivity, it is to be understood that a low resistivity region of the same type may be provided thereon if desired (resulting in an NPIN or NPNN+ structure).

Referring to FIGURE 1A there is shown a semiconductor structure comprising an n-type substrate 10 having formed therein a p-type region 12 which in turn has therein an n-type region 14 thus forming three regions with p-n junctions 11 and 13 therebetween.

The three region structure is one designed to produce or at least capable of producing transistor characteristics. That is, using the same basic semi-conductor structure current in one rectifying contact (collector 10) could be controlled by the forward current in the second rectifying contact (emitter 14). In an advantageous application of the invention, a structure designed for use as a transistor is modified and used as a diode.

It will be noted that for purposes of convenience the substrate 10, and the analogous region of subsequent figures, is hereinafter referred to as the "collector" the p-type layer 12 as the "base" and the other n-type region 14 as the "emitter." This is because of the structural similarity to the regions of transistors. It is, of course, recognized that the terms collector, emitter and base are functional designations of the regions of a junction transistor. For purposes of the present invention, it is immaterial which region is the emitter and which is intended to be collector since they are not necessarily used for that function. However, this nomenclature is used for convenience. Usually, the collector-base junction is considerably larger in area than the base-emitter junction. Hence, the collector and emitter of a three region structure can generally be identified by the relative size of the junctions. It is not necessary for the practice of the present invention that this be the case, however, any three region structure capable of transistor action may be used.

A conductive member 15 shorts out the collector junction 11 to provide a transistorized diode in accordance with this invention. In FIGURE 1A the base and emitter regions 12 and 14 are shown disposed within the substrate and having the junctions 11 and 13 terminate at the planar upper surface. The structure is known in the art as a planar, double diffused structure and would be made by well known techniques. Since the base-collector junction 11 is exposed at the surface it is convenient to short out the junction by conductive means 15 disposed on the surface at the exposed junction. This may be done by any of a variety of methods such as evaporating a conductive material, such as aluminum, through a suitable mask onto the junction and then alloying, or by fusion of an alloy foil.

It is to be understood, however, that the practice of this invention does not depend upon the transistor structure being of the planar double diffused type. It may also be formed by any of the known techniques for providing transistor structures (such as alloying, diffusion, epitaxial growth or a combination of such techniques) including those which result in a structure wherein the base-collector junction is not conveniently exposed on the upper surface.

FIGS. 1B and 1C illustrate such structures; the reference numerals identifying corresponding parts are given the same last digit as in FIG. 1A.

FIGURES 1B and 1C each show structures which are like that of FIGURE 1A except the base-collector junction 21 extends within the block laterally outside the immediate area of the transistor structure. Since the junctions 21 and 31 are not exposed at the surface they cannot be shorted as in FIG. 1A but any suitable means may be employed. FIGURE 1B shows one method of shorting out the base-collector 21 junction by providing a conductive path 25 entirely through the device and thus through the junction 21. This is accomplished by a method known as "cap shooting" whereby fused alloys 26 and 27 on opposite surfaces of the devices are utilized as capacitor plates with voltage applied until there is break down through the semiconductive material resulting in the formation of a permanent conductive path. This method is more fully disclosed in copending application Serial No. 38,051, filed June 22, 1960, by J. P. Stelmak and assigned to the same assignee as the present invention.

FIGURE 1C shows another manner in which the base-collector junction 31 can be shorted. This is a method particularly suitable for structures having a diffused emitter 34. After formation of the p-type base 32 and prior to the formation of the emitter 34 a groove or indentation 38 is formed, for example by etching, in part of the p-type layer 32 to reduce the thickness of the p-type layer at that point to less than the depth of penetration of impurities diffused in the formation of the emitter 34. Therefore, in the emitter diffusion operation the indentation 38 is not covered by a mask and n-type diffusion occurs in it as well as the emitter 34. The structure shown results wherein the n-type impurities diffused in the indentation 38 have formed an in-type region 39 which has penetrated through to the collector 30. This enables the formation of the short by a conductive member 35 disposed on the surface of the device. Since diffusion may not occur equally both laterally and transverse to the surface it is often desirable to extend the conductive member 35 within the recess formed by the indentation 38 to the bottom thereof so as to make certain that the junction is effectively shorted. Of course, this method of shorting the base-collector junction may be employed even when the emitter is not diffused, but in that case extra operations would be necessary.

The devices of FIGURES 1A, B and C may be incorporated within a monolithic semiconductor device with other functional regions. They may also be used as separate devices apart from a monolithic device in the manner of a conventional diode. Of course, when used as separate devices, it is relatively simple to short out a junction at the edge of the device and the shorting means like that of FIGS. 1B and 1C would generally be unnecessary.

Leads 68 are affixed to the emitters 14, 24 and 34 for the diode cathode by means of ohmic contacts 70. Leads 69 are affixed to either of the other regions for the diode anode. The conductive members 15, 26 and 35 may be used as the ohmic contact for the anode, as shown.

FIGURE 1D shows another transistorized diode in accordance with the present invention of three regions 60, 62 and 64 of alternate semiconductivity type forming junctions 61 and 63. Here the shorting means 65 is applied to junction 63, that is, between what would ordinarily be called the emitter and base of the structure rather than to junction 61. Therefore, the junction 61 between the base and collector is that which is utilized as the diode junction.

The structure of FIG. 1D is not as well suited for incorporation within a monolithic device as those of FIGS. 1A–C because problems of interaction with other portions of the device occur in the collector region 60. A lead 58 is affixed to the shorting conductor 65 for one terminal of the device and a lead 59 is affixed to an ohmic contact 71 on the collector 60 for the other terminal.

In FIG. 2 is shown in the left-hand portion of a monolithic device a transistorized diode structure like that of FIG. 1A (with the same reference numerals for corresponding parts). In the right-hand portion is shown an identical structure formed on the same substrate 10 without a short across the base-collector junction 41, so as to permit operation as a junction transistor. The reference numerals of the right-hand portion have the same last digit as the number of the corresponding part of the left-hand portion. Ohmic contacts 50 and leads 48 are provided on the transistor structure as desired.

The similarity between the two structures in right and left-hand portions makes the present invention advantageous. In this way fabrication of the transistorized diode, that is, the left-hand structure providing diode functions, is readily accomplished the same time the transistor structure is fabricated and by shorting out the base-collector junction 15 in the diode structure good diode characteristics are achieved. FIGURE 3 shows the approximate equivalent circuit of the structure of FIGURE 2 with reference numerals the same as the corresponding regions of FIG. 2. The two structures are electrically isolated within the monolith by the high resistance R of the substrate 10.

The spreading resistance $r_b$ is indicated in series with the base 12 of the diode portion of the circuit since it is physically between the junction 13 and the contact 15. When current flows from the emitter 14 (diode cathode), base current flows and develops a voltage drop $I_b r_b$ making the base region more negative in an npn structure than the collector. The relative potentials of the collector and base produce transistor action. This action has been found to reduce the effect of the spreading resistance by a factor equal to the common collector current gain. Also, because the structure has only two terminals, the injected current is not lost and must come out the other terminal. A like result is obtained when the emitter-base junction is shorted and the collector is used as one side of the diode.

FIGURE 4 shows typical results achieved by the practice of the present invention in which the diode current, I, is plotted against the diode voltage drop, V. In the first curve 51 is shown the characteristic of a transistor structure using the base-emitter junction as a diode with the collector open. In the curve 52, using the same semiconductor structure, the collector is shorted to the base with the result shown that the forward drop is considerably less. The values shown in FIGURE 4 are in arbitrary units.

Another important characteristic of a diode is the reverse recovery time which is the time required for the diode to be switched from a forward bias to a reverse bias. This depends upon the number of minority carriers injected into the base (diode anode) region. Injected carriers are stored in the base region and when the diode is switched from forward conduction to cutoff, the total amount of minority carriers stored in the base must be swept away. Therefore, the greater the number of minority carriers which are stored, the longer the recovery time is. When the collector is short circuited to the base, the collector junction is not forward biased there being no applied bias across the junction. Only the emitter junction is forward biased. Since the transistor is not saturated, the minority carrier distribution would essentially be the same if the collector were replaced with a metal contact for the base. This provides a rapid recovery time because only the minority carriers injected from the emitter need be swept away. One the other hand, if the collector is open, the collector junction is forward biased to inject an amount of current equal and opposite to that which is collected from the emitter. With both the emitter and the collector junctions forward biased, more minority carriers are injected into the base than the case in which collector is shorted to the base. Hence, the switching time is also longer.

A very important characteristic is the reverse characteristic of the diode, that is, the voltage at which breakdown occurs in the reverse direction. It has been found that the reverse breakdown voltage is about the same for the case in which the collector is shorted to the base as that in which the collector is open. When the collector junction is not forward biased, there is no additional emitter current due to collector injection, and the emitter current is essentially the emitter saturation current. The reverse current which is the saturation current due to the breaking of hole-electron bonds in the base is not substantially affected by the manner of providing the diode functions in a transistor structure.

Referring to FIGURE 5 there is shown a conventional circuit of an AND gate which is a logic element wherein an output is produced when each of the inputs is on. Instead of conventional diodes, each of the inputs is shown as a transistor having the collector shorted to the base in accordance with this invention.

FIGURE 6 shows a monolithic semiconductor device incorporating regions providing the function of the entire circuit of FIGURE 5. Starting at the left-hand side of the block in the drawing is shown a structure of three regions 80, 82 and 84 with the collector 80 shorted to base 82 by the techniques shown in FIGURE 1C wherein a degenerative n-type region 89 is formed as the emitter 84 is formed and a conductive layer 85 is applied. This is one of the transistorized diodes $D_1$, shown in FIGURE 5; the other, $D_2$, would have a substantially identical structure on the common substrate 80.

A resistive region $R_B$ comprising a portion 72 of the p-type layer extends from the shorted junction 81 to a point 74 for the application of bias potential where the junction is again shorted by the same method using an n-type diffused region 79 and a conductive strip 75 to make contact to the collector region 80′ of the transistor T.

The transistor structure T is just like that of the transistorized diode $D_1$ having collector 80′, base 92 and emitter 94 regions but of course the collector 80 is not shorted to the base 92. The collectors 80 and 80' are physically common but because of the high resistivity (at least about 100 ohm-cm.) of the n-type substrate electrical interaction is slight. Etched grooves 76 are shown to separate the transistor base 92 from the remainder of the p-type layer. Another resistive region 77 in the p-type layer provides the resistance $R_E$ and extends from a point 73 in conductive contact with the emitter 94 of the transistor by means of the conductor 101 to another point 78 for the application of bias potential. Another conductor 102 is provided extending from the transistor base 92 to the shorted junction 81 of the transistorized diode $D_1$. In addition, ohmic contacts and leads are provided where necessary.

It is to be understood that the device of FIGURE 6 is merely representative of the many devices which could be made incorporating the circuit of FIGURE 5 and practicing the present invention. In FIGURE 6 the p-type layer is made by diffusing into the n-type substrate while the emitters 84 and 94 and the bridging portions 79 and 89 are formed by selective diffusion through a suitable mask after the p-type layer has been appropriately etched for isolation grooves 76 and recesses for bridging. Numerous modifications from the particular structure shown are possible, of course. For example, the lower surface of the substrate may be etched in the transistor area to form a recess in which an n-type impurity is diffused to increase the conductivity and to lower saturation resistance. Also, the conductors 101 and 102 may be provided by thin films disposed on the semiconductor structure with an oxide layer providing insulation wherever necessary.

The method by which the device of FIGURE 6 may be formed is applicable to other devices requiring the same combination of functions. A wafer is prepared having suitable size and characteristics for use as the substrate of the device. The manner of growing a crystal, cutting the wafer from it and polishing it may be done in accordance with known techniques. An example of a suitable wafer for use in forming the device of FIG. 6 and also for other devices of similar nature is a wafer of about 105 ohm-centimeters n-type silicon having a thickness of about 9 mils and major surface dimensions of 280 by 265 mils. There is then prepared on at least one surface of the wafer an opposite conductivity type layer. This may be formed by, for example, oxidation of the wafer surface and diffusion of a p-type impurity such as gallium through the oxide layer. Then selective etching is carried out to remove the p-type layer, or at least reduce it in thickness, at points where the p-type layer is to be shorted to the substrate. The areas for the transistor and diode emitters are exposed, as well as the points for shorting, while the remainder of the surface is masked, as by removal of oxide at the desired points while leaving it on the remaining surface and diffusing an n-type impurity such as phosphorus therein. The conductive shorts are provided at the same time as contacts to the necessary regions for example by evaporation of aluminum through a suitable mask and subsequent alloying. It is thus seen that inclusion of the diode structure requires no additional operations to those necessary for fabrication of the transistor alone and further that exceptional diode characteristics result.

While the present invention has been shown and described in certain forms only, it will be obvious to those skilled in the art that it is not so limited but is susceptible of various changes and modifications without departing from the spirit and scope thereof.

I claim as my invention:

1. In a monolithic semiconductor device: a first portion providing the electronic function of a diode, comprising first, second and third semiconductive regions of alternate semiconductivity type with a first p-n junction between said first and second regions and a second p-n junction between said second and third regions, conductive means to short out said second p-n junction; and a second portion providing the electronic function of a transistor comprising fourth, fifth and sixth semiconductive regions of alternate semiconductivity type with a third p-n junction between said fourth and fifth regions and a fourth p-n junction between said fifth and sixth regions; said third region and said sixth region being parts of a single continuous layer of material which physically unites said first and second portions but which is of sufficiently high resistivity to minimize electrical interaction therethrough; said second and fifth regions being disposed within a planar surface of said single continuous layer of material with said second and fourth p-n junctions terminating at said planar surface; said first and fourth regions being disposed respectively within said second and fifth regions with and first and third p-n junctions terminating at said planar surface; said second and fifth regions having the same doping concentration and said first and fourth regions having the same doping concentration to permit simultaneous fabrication of the regions of said first and second portions of the monolithic device.

2. In a monolithic semiconductor device: a first portion providing the electronic function of a diode comprising first, second and third semiconductive regions of alternate semiconductivity type with a first p-n junction between said first and second regions and a second p-n junction between said second and third regions, conductive means to short out said second p-n junction; and a second portion providing the electronic function of a transistor comprising fourth, fifth and sixth semiconductive regions of alternate semiconductivity type with a third p-n junction between said fourth and fifth regions and a fourth p-n junction between said fifth and sixth regions; said third region and said sixth region being parts of a single continuous layer of material which physically unites said first and second portions but which is of sufficiently high resistivity to minimize electrical interaction therethrough conductive means comprising a low resistivity semiconductive region of the same semiconductivity type as said third region disposed in contact with said third region and with said second region and a layer of metal fused to said low resistivity semiconductive region and to said second region.

References Cited by the Examiner

UNITED STATES PATENTS

| | | | |
|---|---|---|---|
| 2,663,830 | 12/53 | Oliver | 317—235 |
| 2,856,320 | 10/58 | Swanson | 317—235 |
| 3,040,188 | 6/62 | Gaertner et al. | 317—234 |
| 3,070,762 | 12/62 | Evans | 317—234 |

JOHN W. HUCKERT, *Primary Examiner.*

ARTHUR GAUSS, DAVID J. GALVIN, *Examiners.*